US006708125B2

United States Patent
Bierl

(10) Patent No.: US 6,708,125 B2
(45) Date of Patent: Mar. 16, 2004

(54) PROCEDURE FOR THE DETERMINATION OF THE CONSUMPTION OF ELECTRICAL ENERGY

(75) Inventor: Lutz Bierl, Erding (DE)

(73) Assignee: Texas Instruments Incorporated, Dallas, TX (US)

( * ) Notice: Subject to any disclaimer, the term of this patent is extended or adjusted under 35 U.S.C. 154(b) by 188 days.

(21) Appl. No.: 09/948,832

(22) Filed: Sep. 7, 2001

(65) Prior Publication Data

US 2002/0063554 A1 May 30, 2002

(30) Foreign Application Priority Data

Sep. 8, 2000 (DE) .......................................... 100 44 401

(51) Int. Cl.[7] .............................................. G06F 19/00
(52) U.S. Cl. ......................................... 702/64; 324/142
(58) Field of Search .............................. 702/57, 60, 62, 702/64, 65, 79, 90, 91, 94, 106, 107, 112, 199; 324/141, 142

(56) References Cited

U.S. PATENT DOCUMENTS

| 4,077,061 A | * | 2/1978 | Johnston et al. ............... 702/58 |
| 4,345,311 A | * | 8/1982 | Fielden ......................... 702/62 |
| 4,495,463 A | * | 1/1985 | Milkovic ...................... 324/142 |
| 4,663,587 A | * | 5/1987 | Mackenzie .................. 324/141 |
| 4,884,021 A | * | 11/1989 | Hammond et al. ......... 324/142 |
| 4,907,165 A | * | 3/1990 | Toda ............................ 702/60 |
| 5,122,735 A | * | 6/1992 | Porter et al. ................. 324/142 |
| 5,446,373 A | * | 8/1995 | Bierl ........................... 324/142 |
| 5,548,209 A | * | 8/1996 | Lusignan et al. ........... 324/142 |

FOREIGN PATENT DOCUMENTS

DE      42 21 057 C2      2/1997

* cited by examiner

*Primary Examiner*—Marc S. Hoff
*Assistant Examiner*—Mohamed Charioui
(74) *Attorney, Agent, or Firm*—Bret J. Petersen; W. James Brady, III; Frederick J. Telecky, Jr.

(57) ABSTRACT

Procedure for the determination of the consumption of electrical energy by a consumer in a procedure for the determination of the consumption of electrical energy by a consumer, the sinusoidal alternating voltage applied to the consumer and the sinusoidal alternating current flowing to the consumer are measured at points in time which correspond to a pre-determined sampling rate. Products are formed of the values measured, and the products are added together for the duration of the energy consumption by the consumer. For each voltage value measured at a voltage-measurement point in time, in accordance with the timing interval of the sampling period, current values are measured at points Δt before the voltage measurement point in time and at Δt after the voltage measurement point in time. For the formation of the product, each measured voltage value is multiplied by the current value measured Δt before the voltage measurement point in time, and for the formation of the sum the arithmetic mean values of the products from each of the measured voltage values over the duration of consumption of energy by the consumer are added together.

2 Claims, 2 Drawing Sheets

PROCEDURE FOR THE DETERMINATION OF THE CONSUMPTION OF ELECTRICAL ENERGY

Figure 1:
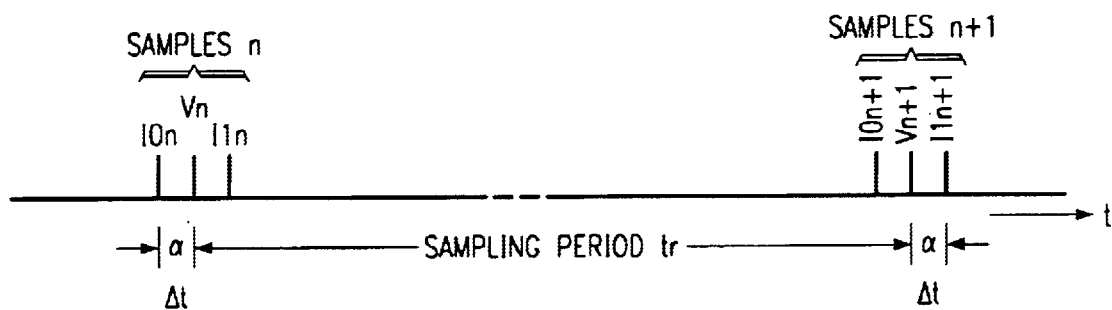

The invention relates to a procedure for the determination of the consumption of electrical energy by a consumer by the measurement of the sinusoidal alternating voltage applied to the consumer and the sinusoidal alternating current flowing to the consumer at points in time according to a pre-determined sampling rate, the formation of the product of the values measured, and the formation of the sum of the products for the duration of the energy consumption by the consumer.

For the determination of the energy consumption by a consumer, it is necessary, in principle, to obtain the product of the voltage applied to the consumer and of the current flowing through the consumer, and this product has to be integrated over the period of time when energy is consumed. At present it is standard practice to digitize the measured values thus obtained and to process these further in the form of digital data. The German patent specification No. 42 21 057 describes a procedure whereby the sine-shaped alternating voltage and the sine-shaped alternating current are sampled at periodic intervals, the values sampled are converted into digital values, and further processing in order to obtain the required energy value then proceeds on the basis of the digitized samples. To reduce the number of sampling processes required, the alternating voltage and the alternating current are alternately sampled at time intervals determined by the sampling rate, and the product is formed by using the present sample as well as the sample obtained from the previous sampling period. This procedure necessitates the application of a correction factor for the determination of the energy consumption, which is dependent on the frequency of both the alternating current and the alternating voltage, as well as on the sampling period. Because of this dependency, the application flexibility of this known procedure is limited, except in certain application cases where a measurement error can be tolerated.

The invention rests on the requirement to provide a procedure of the type previously indicated whereby, in spite of the time-shifted sampling of the voltage and current values, energy consumption values can be obtained, the precision of which is independent of the sampling period at which sampling of the voltage and current values takes place.

According to the invention, this requirement is met in that for each voltage value measured at a voltage-measurement point in time, in accordance with the timing interval of the sampling period, a current value is sampled, at points Δt before the voltage measurement point in time and Δt after the voltage measurement point in time, that the product is formed by multiplying each measured voltage value by the current value measured Δt before the voltage measurement point in time, and by the current value measured Δt after the voltage measurement point in time, and that for the formation of the sum, the arithmetic mean values of the products from each of the measured voltage values over the duration of consumption of energy by the consumer are added together.

When applying the procedure according to the invention, several products are formed at time intervals corresponding to the sampling period, that is from the sampled voltage value and the sampled current values immediately before and immediately after the point in time of the measurement. The mean values of the products formed from each sampled voltage value are added up for the duration of the energy consumption period. Although the energy consumption value obtained by the application of the procedure according to the invention contains a system-inherent measurement error, this depends only on the separation in time between the sampling points of the measured voltage value and those of the corresponding measured current values, whereby this time difference for the performance of the sampling process can be kept extremely short by using modern processors.

An advantageous further embodiment consists in that, in addition to the current values measured at Δt before and after the voltage measurement point, two further current values displaced by 2 Δt before and after the voltage measurement point are sampled, and that for the voltage value measured, products are formed of all four current values related to the voltage value concerned.

On the strength of this further embodiment, this system-implied error can be further reduced.

Figure 3:
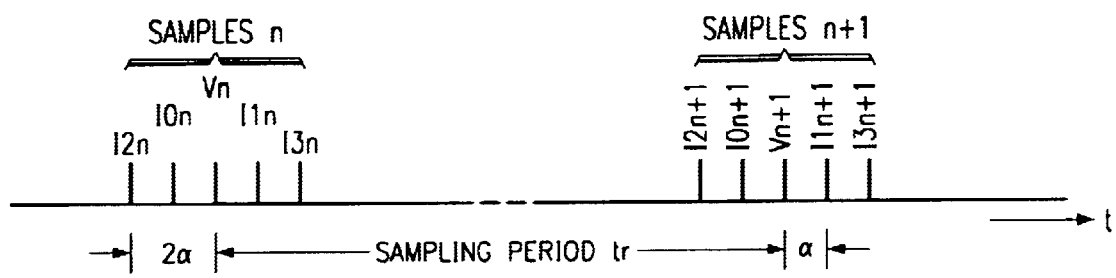

The invention shall now be explained in exemplified form with reference to the drawings, where FIG. 1 is a diagram to explain the acquisition of the voltage and current values in succeeding sampling periods, FIG. 2 shows a diagram A with current and voltage curves with indication of the corresponding sampling points in time and the temporal relationship of these sampling points with respect to each other, and a diagram B plotting the course of the exact instantaneous power, as well as the course of the instantaneous power determined by digital means by application of the procedure according to the invention, and FIG. 3 is a similar diagram to that of FIG. 1, for the purpose of explaining a further embodiment of the procedure according to the invention.

FIG. 1 shows in schematic representation how the samples of both the voltage and the current are formed in temporal relationship to each other. In a first sampling process, a voltage sample Vn, and, at a temporal distance of Δt before and after this, the current samples I0n and I1n, respectively are generated. The phase displacement between the voltage sample and the two current samples amounts to α in each case. After the time space of the sampling period tr, the next voltage sampling value Vn+1 and, again, at the temporal displacement of Δt before and after this, the current samples I0n+1 and respectively I1n+1 are formed. This sampling pattern continues periodically during the time when the consumer takes up energy.

For the computation of the energy, products of the voltage sample and of the current samples sampled just before and after this are produced. These two products are averaged out and the average values are added up for the time period where energy is taken up by the consumer. The result is the energy consumption to be measured. Expressed in the form of equations, the energy consumption is as follows:

$$W = 0.5 \times \sum_{n=0}^{n=\infty} Vn \times (I0n + I1n) \times tr$$

Since the voltage samples and the current samples used for the formation of the products are not acquired simultaneously, an error will result which, as can be shown, will depend exclusively on the phase angle between the voltage sampling value and the related current samples used for the formation of the product. This phase angle is shown as α in FIG. 1. The fact that the error is dependent exclusively on the phase angle can be demonstrated in the following, where the error is denoted as e, the energy value subject to error as W*, and the correct energy value as W.

$$e = \frac{W^*}{W} - 1$$

$$e = \frac{V \times 0.5 \times (I \times \cos(\varphi - \alpha) + I \times \cos(\varphi + \alpha)) \times t}{V \times I \times \cos\varphi \times t} - 1$$

$$e = \frac{0.5 \times (\cos(\varphi - \alpha) + \cos(\varphi + \alpha))}{\cos\varphi} - 1$$

$$e = \frac{0.5 \times (\cos\varphi \times \cos\alpha + \sin\varphi \times \sin\alpha + \cos\varphi \times \cos\alpha - \sin\varphi \times \sin\alpha)}{\cos\varphi} - 1$$

$$e = \frac{0.5 \times 2 \times \cos\varphi \times \cos\alpha}{\cos\varphi} - 1 = \cos\alpha - 1$$

Expressions in the equations are:

α: Phase angle between the current sample and the voltage sample, $$\alpha = \omega \times \Delta t = 2\pi \times f \times \Delta t$$

φ: Phase shift between the sine-shaped alternating current and the sine-shaped alternating voltage, V: Root-mean-square value of the alternating voltage, I: Root-mean-square value of the alternating current, f: Mains frequency.

If, for example, a 12-bit analogue-to-digital converter of the type MSP 430×14×, with a conversion time of 2.6 μs at 5 MHz, is used for the sampling of the voltage and current values, the current and voltage samples can be acquired with a temporal separation of 10 μs from each other. If the mains frequency f=50 Hz, a phase angle α=2π×50×10 μs, 3.14159×10⁻³ will result. If there is no phase shift between the alternating voltage and the alternating current, then by application of the above-given error formula, an error of e=−0.00049% results. Since this error e, as demonstrated, is independent of the phase shift between the current and the voltage, even at a very large phase shift of, for example, 89° still only the very small error of −0.00049% will result.

The proposed principle of sampling the current and voltage values has as a consequence that the resolution of the analogue-to-digital converter used is improved, in practice, by one bit, that is to say by a factor of two. The result is an unavoidable small and constant error, which can easily be compensated for, if necessary. This unavoidable error is independent of the voltage, of the current and of the phase shift. Furthermore, only one analogue-to-digital converter is required, since no simultaneous sampling processes have to take place.

Figure 2A:
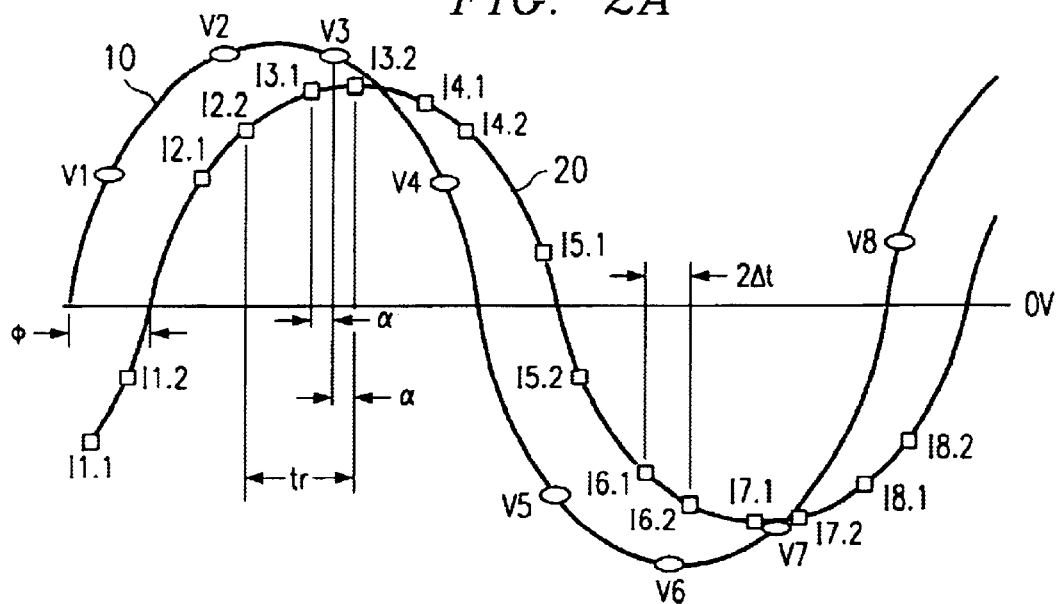

FIG. 2 shows in more detail how both the current and the voltage can be sampled by using the principle described. The voltage curve is denoted 10 in FIG. 2A, whilst the current curve is denoted 20. As this diagram shows, voltage samples V1 to V8 are generated at intervals of the sampling period tr, and in association with the corresponding voltage values, the current samples I1.1, I1.2, I2.1, I2.2 . . . I8.1, I8.2 are acquired. The phase angle between the voltage value and the corresponding current values, in each case, is a, whilst a phase shift of φ obtains between the current curve 20 and the voltage curve 10.

Figure 2B:
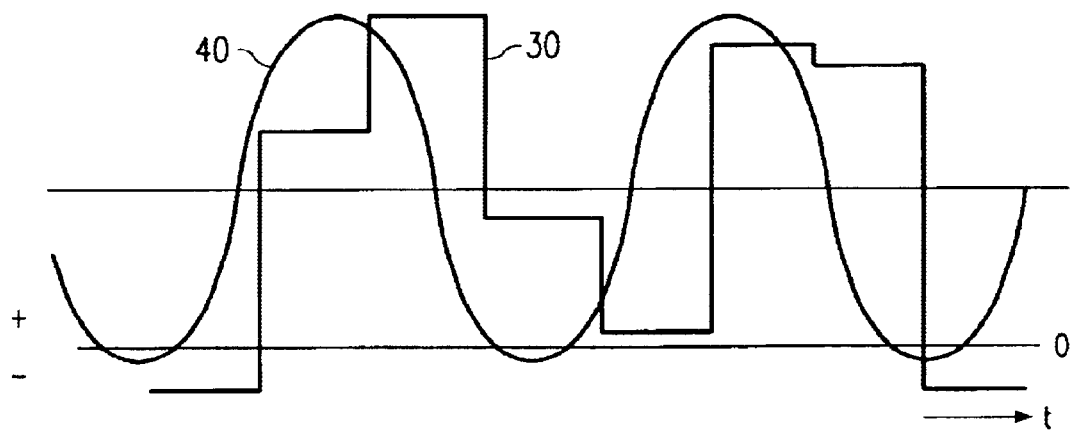

The diagram B of FIG. 2 shows a step pattern, drawn in bold, which corresponds to the mean values of the power taken up at the points in time of the corresponding voltage sampling instances. This instantaneous power take-up is, for example, half of the products V1×I1.1 and V1×I1.2. The step pattern 30 in FIG. 2B only shows large steps since, for reasons of greater clarity, only a few sampling points have been shown in the diagram of FIG. 2A. Under real measurement conditions, however, substantially more sampling points would be acquired within one period (for example up to 100), so that a correspondingly continuous curve 30 would be created. The greater the number of samples acquired within one sampling period, the more the shape of the curve 30 would approach that of the curve 40. The curve 40 in FIG. 2B indicates the progress of the instantaneous power that would obtain if at each point in time the product between the current and the voltage values had been computed in an analogue manner.

The degree of precision can be further increased in that not only one current value is acquired at a temporal displacement before and after each acquired voltage value, but that two current values are acquired before each voltage value sample, and two current values after each voltage sample, whereby the temporal distance between the individual sampling procedures is Δt in each case. FIG. 3 shows this sampling principle. Four value pairs are therefore available in each case for the formation of the product, that is the voltage sampling value and the four associated current samples. The energy to be measured results in this case from the following formula:

$$W = 0.25 \times \sum_{n=0}^{n=\infty} Vn \times (I0n + I1n + I2n + I3n) \times tr$$

As to the error occurring when using this sampling principle, the same considerations as above apply, whereby the resulting error is as follows:

$$e = 0.5 \times (\cos\alpha + \cos 2\alpha) - 1$$

What is claimed is:

1. Method for the determination of the consumption of electrical energy by a consumer comprising: measuring the sinusoidal alternating voltage applied to the consumer, measuring sinusoidal alternating current flowing to the consumer at points in time according to a pre-determined sampling rate, forming products of the values measured, and forming a sum of the products for the duration of the energy consumption by the consumer, wherein for each voltage value measured at a voltage-measurement point in time, in accordance with the timing interval of the sampling period, a current value is sampled, at points Δt before the voltage measurement point in time and Δt after the voltage measurement point in time, the product is formed by multiplying each measured voltage value by the current value measured Δt before the voltage measurement point in time, and by the current value measured Δt after the voltage measurement point in time, and for the formation of the sum, arithmetic mean values of the products from each of the measured voltage values over the duration of consumption of energy by the consumer are added together.

2. Method according to claim 1, further comprising measuring two further current values, temporally displaced by 2 Δt, before and, respectively, after the voltage measurement point in time, and forming products of the measured voltage value with all four current values associated with this voltage value.

* * * * *